(12) United States Patent
Zhang et al.

(10) Patent No.: US 10,964,830 B2
(45) Date of Patent: Mar. 30, 2021

(54) SURFACE PLASMON-SEMICONDUCTOR HETEROJUNCTION RESONANT OPTOELECTRONIC DEVICE AND PREPARATION METHOD THEREFOR

(71) Applicant: SOUTHEAST UNIVERSITY, Nanjing (CN)

(72) Inventors: Tong Zhang, Nanjing (CN); Shanjiang Wang, Nanjing (CN); Xiaoyang Zhang, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 16/970,638

(22) PCT Filed: May 28, 2018

(86) PCT No.: PCT/CN2018/088734
§ 371 (c)(1),
(2) Date: Aug. 18, 2020

(87) PCT Pub. No.: WO2019/169746
PCT Pub. Date: Sep. 12, 2019

(65) Prior Publication Data
US 2021/0050464 A1 Feb. 18, 2021

(30) Foreign Application Priority Data
Mar. 7, 2018 (CN) .......................... 201810188107.1

(51) Int. Cl.
H01L 31/0352 (2006.01)
H01L 31/109 (2006.01)

(52) U.S. Cl.
CPC .... *H01L 31/035209* (2013.01); *H01L 31/109* (2013.01)

(58) Field of Classification Search
CPC ...................... H01L 31/035209; H01L 31/109
See application file for complete search history.

(56) References Cited

FOREIGN PATENT DOCUMENTS

| CN | 102365902 A | 2/2012 |
| CN | 103022899 A | 4/2013 |
| CN | 106513284 A | 3/2017 |
| CN | 106848007 A | 6/2017 |
| CN | 106876513 A | 6/2017 |
| WO | 2013046865 A1 | 4/2013 |

*Primary Examiner* — Hoang-Quan Ho
(74) *Attorney, Agent, or Firm* — Bayramoglu Law Offices LLC

(57) ABSTRACT

A surface plasmon-semiconductor heterojunction resonant optoelectronic device and a preparation method thereof are provided. A surface ligand molecule is modified on a plasmonic nanostructure, a plasmonic crystal face structure is bound to the surface ligand molecule, a semiconductor nanostructure seed crystal is located on the plasmonic crystal face structure, a one-dimensional semiconductor nanostructure is located on the semiconductor nanostructure seed crystal, and all parts are in tight contact. The heterogeneous integration material achieves a lattice match at an interface, greatly reduces a loss caused by defects and rough crystal faces, and can achieve direct coupling of a surface plasmon mode and an optical mode. The heterogeneous integration material has a large application prospect in the fields of a nanolaser, a nano heat source and photoelectric detection and photocatalysis.

11 Claims, 2 Drawing Sheets

SURFACE PLASMON-SEMICONDUCTOR HETEROJUNCTION RESONANT OPTOELECTRONIC DEVICE AND PREPARATION METHOD THEREFOR

CROSS REFERENCE TO THE RELATED APPLICATIONS

This application is the national stage entry of International Application No. PCT/CN2018/088734, filed on May 28, 2018, which is based upon and claims priority to Chinese Patent Application No. 201810188107.1, filed on Mar. 7, 2018, the entire contents of which are incorporated herein by reference.

TECHNICAL FIELD

The present invention relates to the fields of nanomaterials and integrated optical devices, and in particular, to a surface plasmon-semiconductor heterojunction resonant optoelectronic device and a preparation method therefor.

BACKGROUND

With continuous development of semiconductor theory, how to construct a semiconductor optoelectronic device with high quantum efficiency, low cost and mass production while miniaturization and integration of devices are being pursued is a hot spot direction of present research, and a trail is blazed in a series of new application fields. However, due to problems of band gap limitation of a semiconductor nano material and recombination of photo-generated carriers, conventional optoelectronic devices based on a semiconductor material have defects such as limited response wavelengths, and low quantum efficiency. Consequently, the devices limit its application range and further industrialization and marketization in aspects such as practicability, reliability, and cost. With the rise of surface plasmon research, a new opportunity is provided for development of the semiconductor-based optoelectronic device technologies. The surface plasmon has a significant near-field local enhancement characteristic, and can be used as a "nano antenna" to greatly improve local light intensity density. An adjustable resonance spectrum from an ultraviolet waveband to a mid-infrared waveband is achieved by changing factors such as geometry, materials, sizes and environmental mediums of a nanostructure. In addition, Purcell pointed out that density of states of an electromagnetic field around a material can be controlled by properly constructing a specific cavity and a waveguide structure, to further control the spontaneous emission rate of the material. This effect is referred to as the Purcell effect. Based on this effect, for effectively improving the quantum efficiency of the semiconductor material, high density of states and a small mode volume may help obtain a larger Purcell factor. Therefore, if the plasmonic effect and the Purcell effect can be effectively combined, that is, light emission frequency corresponding to the semiconductor material is close to the surface plasmon resonance frequency, the quantum efficiency of the semiconductor optoelectronic device is significantly improved, and a utilization rate of optical energy is greatly increased.

With the development of semiconductor processing techniques, research on active and passive optoelectronic devices based on surface plasmon-semiconductor heterogeneous integration is emerging endlessly. However, most of preparation processes achieve the heterogeneous integration of two different materials only by soldering, binding, modification, assembly, and the like. The fabrication processes are complex, the cost is high, and the cycle is long. At the same time, it is difficult for the above technical means to achieve the semiconductor material with an adjustable length-to-diameter ratio, controllable density and variable orientation on the plasmonic structure. Due to a crystal face mismatch between different materials, the formed heterogeneous-integration optoelectronic devices have a higher interface loss and many uncertainties. The practicality and stability of the devices also need to be further explored.

Therefore, there is an urgent need for a high-efficiency heterogeneous-integration optoelectronic device that is high quality, stable, and capable of mass production, to avoid defects, such as poor "specificity" (leading to an extremely likely generation of a core-shell structure so that light wave conduction cannot be achieved), and being uncontrollable, caused by conventional technical means for constructing the crystal faces, so as to achieve direct and efficient coupling of a surface plasmon mode and an optical mode.

SUMMARY

An objective of the present invention is overcoming disadvantages of the prior art, and providing a surface plasmon-semiconductor heterojunction resonant optoelectronic device. In the method, a specific metal crystal face is chemically bound, and a semiconductor structure with the controllable density, length-to-diameter ratio and orientation is strictly achieved by combining semiconductor seed crystals and continuous growth thereof. Various active and passive surface plasmon optoelectronic devices can be achieved by controlling the heterogeneous integration structure process, which has an important application in the fields of nano materials and integrated optoelectronic devices.

A surface plasmon-semiconductor heterojunction resonant optoelectronic device of the present invention includes a plasmonic nanostructure, a surface ligand molecule, a plasmonic crystal face structure, a semiconductor nanostructure seed crystal and a one-dimensional semiconductor nanostructure, where the surface ligand molecule is modified on the plasmonic nanostructure, the plasmonic crystal face structure is bound to the surface ligand molecule, the semiconductor nanostructure seed crystal is located on the plasmonic crystal face structure, the one-dimensional semiconductor nanostructure is located on the semiconductor nanostructure seed crystal, and all parts are in tight contact.

Among them, the plasmonic nanostructure is an anisotropic crystal material with morphology of a triangular plate, a wire or a decahedron, a long axis size of which is 10-10000 nm, or an isotropic crystal material with morphology of a sphere or a symmetric polyhedron, a size of which is 10-3000 nm.

An optional material of the plasmonic nanostructure is a metal material with a surface plasmon effect such as gold, silver, copper, aluminum, or platinum.

An optional material of the surface ligand molecule is cetyltrimethylammonium bromide (CTAB), polyvinylpyrrolidone (PVP) or mercaptopropionic acid (MPA).

The plasmonic crystal face structure is an anisotropic material with morphology of a triangular plate, a cone or a cube, a size of which is 1-10 nm.

An optional material of the plasmonic crystal face structure is a small-sized metal nanostructure consistent with the used material of the plasmonic nanostructure.

Morphology of the semiconductor nanostructure seed crystal is a sphere, a cone or a rod, a size of which is 1-10 nm, and an optional material is zinc oxide, aluminum oxide or cuprous oxide.

The one-dimensional semiconductor nanostructure is a one-dimensional nanostructure with morphology of a rod, a cone or a tube, a size of which is 10-10000 nm, and an optional material is a large-sized metal microstructure or nanostructure consistent with the used material of the semiconductor nanostructure seed crystal.

A preparation method for the surface plasmon-semiconductor heterojunction resonant optoelectronic device includes the following steps:

step one: construction of a specific plasmonic crystal face structure subjecting a 0.01-1 Mol/L aqueous solution of a plasmonic nanostructure to repeated centrifugation and water washing, and re-dispersing the precipitate in deionized water, to obtain a solution a;

adding a 0.01-1 Mol/L aqueous solution of a surface ligand molecule to the solution a, and stirring, to allow the surface ligand molecule to be adsorbed onto a specific crystal face of the plasmonic nanostructure due to crystal face selectivity, to obtain a solution b; and adding a 0.001-0.1 Mol/L aqueous solution of the plasmonic crystal face structure to the solution b, stirring to allow the plasmonic crystal face structure and the ligand molecule in the specific crystal face position of the plasmonic nanostructure to be in tight contact by virtue of a covalent bond, subjecting to repeated centrifugation and water washing, re-dispersing the precipitate in deionized water, to obtain a solution c; and Step Two: Preparation and Continuous Growth of the Semiconductor Seed Crystal adding a 0.01-0.1 Mol/L aqueous solution of the semiconductor seed crystal to the solution c, and stirring for 1-4 h to allow the semiconductor seed crystal to be adsorbed onto the specific crystal face of the plasmonic nanostructure;

subjecting to repeated centrifugation and water washing, removing the excess semiconductor seed crystals in the solution, and re-dispersing the precipitate in deionized water, to obtain a solution d; and to obtain a one-dimensional semiconductor nanostructure, sequentially adding a 0.001-0.1 Mol/L aqueous solution of a metal salt, a 0.001-0.1 Mol/L aqueous solution of a weak reducing agent and a 0.01-0.1 Mol/L aqueous solution of a surface capping agent to the solution d and reacting at 60-90° C. for 1-18 h; subjecting to repeated centrifugation and water washing, and re-dispersing the precipitate in deionized water, to obtain the final surface plasmon-semiconductor heterojunction.

A working manner of the surface plasmon-semiconductor heterojunction resonant optoelectronic device is as follows: When exciting light is incident on a surface of the plasmonic nanostructure 1, based on the plasmonic effect, the plasmonic nanostructure 1 gathers the light in a sub-wavelength range to form a resonance enhancement. The resonance enhancement has wavelength selectivity. A position and a waveband width of a resonance absorption peak are related to morphology, a size and an environmental medium of the plasmonic nanostructure 1. Next, a generated surface plasmon wave is excited into a waveguide of the one-dimensional semiconductor nanostructure 5 being in tight contact with the plasmonic nanostructure 1 to form directed distribution of an optical signal. The process can be reversed, that is, the exciting light can be incident into the waveguide of the one-dimensional semiconductor nanostructure 5 with a photoelectric effect to conduct and gather the light, in a manner of photoluminescence, in the plasmon nanostructure 1 and to excite its plasmons. Finally, the plasmons can be used to achieve a nano heat source based on a photothermal effect of the plasmon, a nanolaser enhanced by the photoluminescence and a photocatalytic reaction carrier based on a "hot electron" effect.

An optional material of the metal salt solution is a metal salt, a metallic element of which is consistent with the metallic element in the semiconductor nanostructure seed crystal, such as zinc acetate, aluminum chloride, or copper nitrate. An optional material of the weak reducing agent solution is ascorbic acid (AA), an aqueous solution of hydrogen peroxide ($H_2O_2$) or hexamethylenetetramine (HTMA). An optional material of the surface capping agent is a capping agent capable of promoting growth of the semiconductor nanostructure along a one-dimensional direction, such as polyethylenimine (PEI), triton X-100, or sodium bis(2-ethylhexyl) sulfosuccinate (AOT).

Compared with the prior art, the present invention has the following advantages:

1. The present invention provides a new method for manufacturing a heterogeneous structure with a nano-resonance mechanism in large quantities. Semiconductor nanostructure growth with a controllable length-to-diameter ratio and adjustable density is achieved by selectively constructing a specific metal crystal face. Compared with conventional technical means, the non-core-shell structure can simultaneously achieve direct coupling of a localized surface plasmon resonance (LSPR) effect and an optical mode, and also avoid an interface loss caused by the technical means of conventional processes such as soldering, assembly, and binding. By controlling crystal face structures, a series of heterojunctions with different morphology, structures and orientation can be grown, and can be configured to construct various passive and active optoelectronic devices such as a nano antenna, a nano heat source, and a plasmonic laser.

2. The present invention provides a surface plasmon-semiconductor heterojunction resonant optoelectronic device structure. Compared with a conventional semiconductor optoelectronic device, the structure can be designed in a plurality of dimensions. A monocrystalline and atom-level one-dimensional semiconductor nanostructure and a plasmonic nanostructure are directly combined, avoiding a high loss problem caused due to a reason such as a material surface defect and a rough interface. At the same time, advantages, such as a near-field height local-area enhancement characteristic, and an adjustable response spectrum, brought by a plasmonic effect, are used to significantly improve quantum efficiency of the device by optimizing the structure of the semiconductor material. The structure can simultaneously achieve conversion of a surface plasmon-optical mode or a light-surface plasmon mode, and achieve an integrated nano optical device with high performance and low cost.

3. The present invention provides a new crystal face construction method. A characteristic that a surface ligand molecule has crystal face specificity adsorption is used to achieve its adsorption in a specific crystal face position on a specific plasmonic nanostructure, and further bind an added metal seed crystal with controllable density. Compared with a conventional method for constructing a crystal face such as electron beam lithography, and nano imprinting, the method has characteristics such as low process cost, and mass production. The above two are bound in the form of a covalent bond, and stability is higher. In addition, the specific crystal face constructed by a chemical method is also convenient for subsequently performing next technical means such as continuous growth, and modification. The process is simple and highly maneuverable. It is a breakthrough in existing processes of constructing a specific crystal face on a plasmonic nanomaterial.

Figure 1:
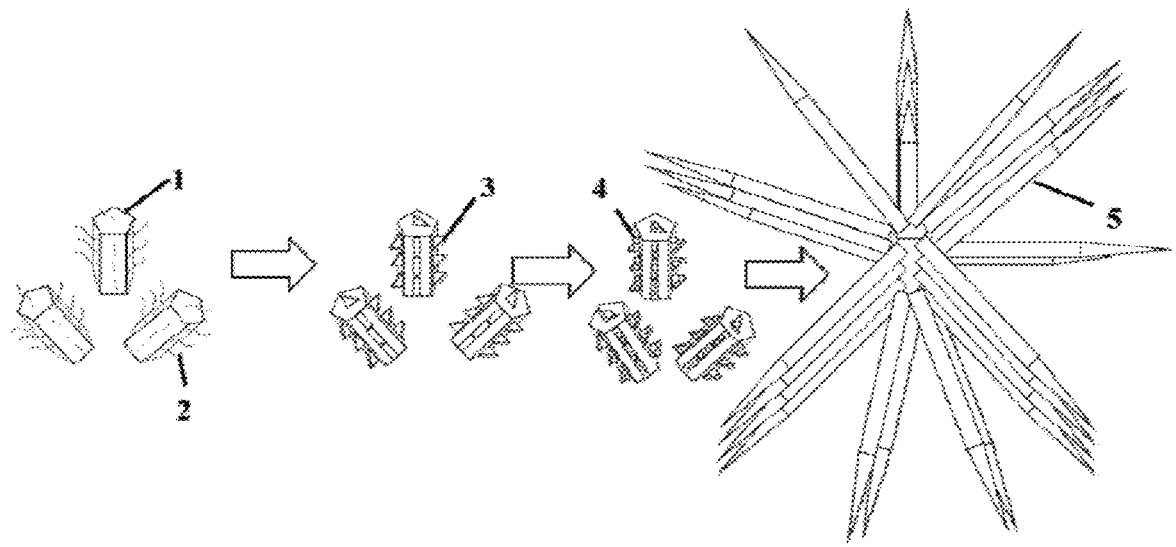
FIG. 1 is a schematic diagram of a growth process of a surface plasmon-semiconductor heterojunction resonant optoelectronic device.
Figure 2:
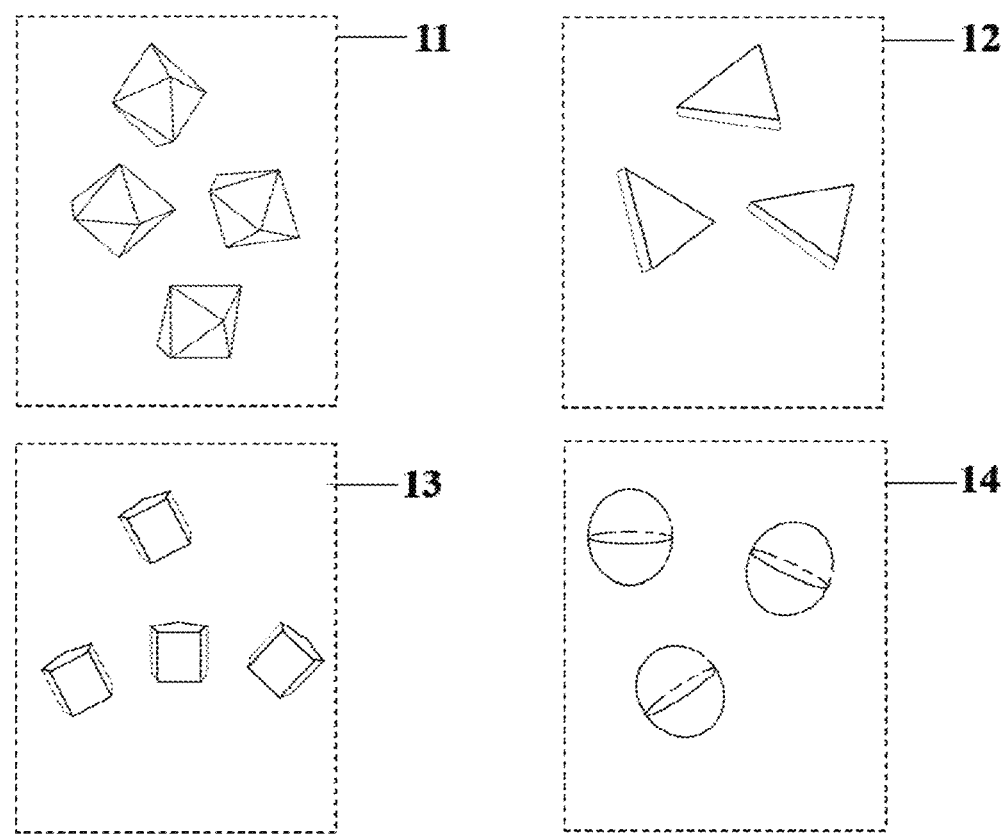
FIG. 2 is a schematic diagram of morphology of a plasmonic nanostructure.
Figure 3:
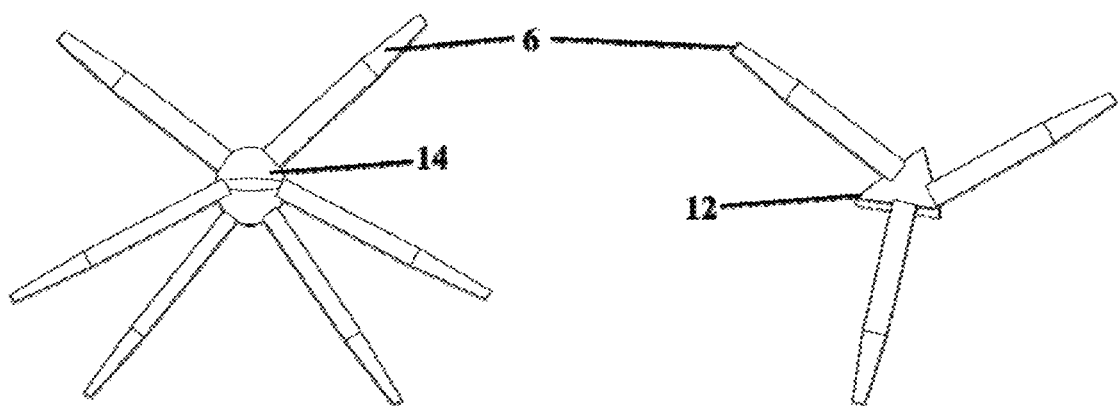
FIG. 3 is a schematic structural diagram of surface plasmon-semiconductor heterojunctions with different morphology.

In the figures, there are a plasmonic nanostructure 1, nano decahedrons 11, nano triangular plates 12, nanorods 13, nanospheres 14, a surface ligand molecule 2, a plasmonic crystal face structure 3, a semiconductor nanostructure seed crystal 4, a one-dimensional semiconductor nanocone 5 and a one-dimensional semiconductor nanopillar 6.

DETAILED DESCRIPTION OF THE EMBODIMENTS

The present invention is further described below with reference to specific examples and comparative examples:

Example 1

A structure of a surface plasmon-semiconductor heterojunction resonant optoelectronic device includes a plasmonic nanostructure being a silver nano decahedron, a size of which is 20 nm, a surface ligand molecule being cetyltrimethylammonium bromide (CTAB), a plasmonic crystal face structure being a silver triangular plate, a size of which is 5 nm, a semiconductor nanostructure seed crystal being zinc oxide, and a one-dimensional semiconductor nanostructure being a zinc oxide nanorod, a size of which is 500 nm. The position relationships thereof are as follows: Cetyltrimethylammonium bromide (CTAB) is modified on a specific crystal face of the silver nano decahedron, the silver triangular plate crystal face is bound to cetyltrimethylammonium bromide (CTAB), the zinc oxide seed crystal is located on the silver triangular plate crystal face, the zinc oxide nanorod is located on the zinc oxide seed crystal, and all parts are in tight contact.

A preparation method includes the following steps:

Step One: Construction of a Specific Plasmonic Metal Crystal Face Structure

The 0.01 Mol/L silver nano decahedron solution was subjected to repeated centrifugation and water washing, and the precipitate was re-dispersed in deionized water, to obtain a solution a; and 0.01 Mol/L cetyltrimethylammonium bromide (CTAB) was added to the solution a, and stirring was performed, to allow the molecule to be adsorbed onto the specific crystal face of the silver nano decahedron due to crystal face selectivity, to obtain a solution b. The 0.01 Mol/L silver triangular plate crystal face was added to the solution b, stirring was performed to allow the triangular plate crystal face to be bound to the specific crystal face position of the silver nano decahedron by cetyltrimethylammonium bromide (CTAB), the solution was subjected to repeated centrifugation and water washing, and the precipitate was re-dispersed in the deionized water, to obtain a solution c.

Step Two: Preparation and Continuous Growth of the Semiconductor Seed Crystal

The 0.05 Mol/L zinc oxide seed crystal solution was added to a certain amount of the solution c, and stirring is performed for 1 h to allow the zinc oxide seed crystal to be adsorbed onto the silver triangular plate crystal face. The solution is subjected to repeated centrifugation and water washing, the excess zinc oxide seed crystals in the solution were removed, and the precipitate was re-dispersed in the deionized water, to obtain a solution d. To obtain the one-dimensional zinc oxide nanorod structure, a 0.1 Mol/L zinc acetate solution, a 0.1 Mol/L ascorbic acid (AA) solution and a 0.1 Mol/L polyethylenimine (PEI) solution were successively added to the solution d, and reaction was performed at 90° C. for 2 h. The solution is subjected to repeated centrifugation and water washing, and the precipitate was re-dispersed in the deionized water, to obtain the final silver decahedron-zinc oxide nanorod heterojunction.

Example 2

A structure of a surface plasmon-semiconductor heterojunction resonant optoelectronic device includes a plasmonic nanostructure being a gold nano triangular plate, a size of which is 60 nm, a surface ligand molecule being polyvinylpyrrolidone (PVP), a plasmonic crystal face structure being a gold nanorod, a size of which is 10 nm, a semiconductor nanostructure seed crystal being copper oxide, and a one-dimensional semiconductor nanostructure being a copper oxide nanocone, a size of which is 1000 nm. The position relationships thereof are as follows: Polyvinylpyrrolidone (PVP) is modified on a specific crystal face of the gold nano triangular plate, the gold nanorod crystal face is bound to polyvinylpyrrolidone (PVP), the copper oxide seed crystal is located on the gold nanorod crystal face, the copper oxide nanocone is located on the copper oxide seed crystal, and all parts are in tight contact.

A preparation method includes the following steps:

Step One: Construction of a Specific Plasmonic Crystal Face Structure

The 1 Mol/L gold nano triangular plate solution was subjected to repeated centrifugation and water washing, and the precipitate was re-dispersed in deionized water, to obtain a solution a; and 0.1 Mol/L polyvinylpyrrolidone (PVP) was added to the solution a, and stirring was performed, to allow the molecule to be adsorbed onto the specific crystal face of the gold nano triangular plate due to crystal face selectivity, to obtain a solution b. The 0.1 Mol/L gold nanorod was added to the solution b, stirring was performed to allow the gold nanorod crystal face to be bound to the specific crystal face position of the gold nano triangular plate by polyvinylpyrrolidone (PVP), the solution was subjected to repeated centrifugation and water washing, and the precipitate was re-dispersed in the deionized water, to obtain a solution c.

Step Two: Preparation and Continuous Growth of the Semiconductor Seed Crystal

The 0.1 Mol/L copper oxide seed crystal solution was added to a certain amount of the solution c, and stirring is performed for 2 h to allow the copper oxide seed crystal to be adsorbed onto the gold nanorod crystal face. The solution is subjected to repeated centrifugation and water washing, the excess copper oxide seed crystals in the solution were removed, and the precipitate was re-dispersed in the deionized water, to obtain a solution d. To obtain the one-dimensional copper oxide nanocone structure, a 0.1 Mol/L copper nitrate solution, a 0.1 Mol/L hydrogen peroxide solution and a 1 Mol/L triton X-100 solution were successively added to the solution d, and reaction was performed at 80° C. for 6 h. The solution is subjected to repeated centrifugation and water washing, and the precipitate was re-dispersed in the deionized water, to obtain the final gold triangular plate-copper oxide nanocone heterojunction.

Example 3

A structure of a surface plasmon-semiconductor heterojunction resonant optoelectronic device includes a plasmonic nanostructure being a platinum nanorod, a size of which is 80 nm, a surface ligand molecule being mercaptopropionic acid (MPA), a plasmonic crystal face structure being a platinum nanocube, a size of which is 20 nm, a semiconductor nanostructure seed crystal being aluminum oxide, and a one-dimensional semiconductor nanostructure being an aluminum oxide nanorod, a size of which is 500 nm. The position relationships thereof are as follows: Mercaptopropionic acid (MPA) is modified on a specific crystal face of the platinum nanorod, the platinum nanocube crystal face is bound to mercaptopropionic acid (MPA), the aluminum oxide seed crystal is located on the platinum nanocube crystal face, the aluminum oxide nanorod is located on the aluminum oxide seed crystal, and all parts are in tight contact.

A preparation method includes the following steps:

Step One: Construction of a Specific Plasmonic Crystal Face Structure

The 0.01 Mol/L platinum nanorod solution was subjected to repeated centrifugation and water washing, and the precipitate was re-dispersed in deionized water, to obtain a solution a; and 0.01 Mol/L mercaptopropionic acid (MPA) was added to the solution a, and stirring was performed, to allow the molecule to be adsorbed onto the specific crystal face of the platinum nanorod due to crystal face selectivity, to obtain a solution b. The 0.1 Mol/L platinum nanocube crystal face structure was added to the solution b, stirring was performed to allow the platinum nanocube crystal face to be bound to the specific crystal face position of the platinum nanorod by mercaptopropionic acid (MPA), the solution was subjected to repeated centrifugation and water washing, and the precipitate was re-dispersed in the deionized water, to obtain a solution c.

Step Two: Preparation and Continuous Growth of the Semiconductor Seed Crystal

The 0.1 Mol/L aluminum oxide seed crystal solution was added to a certain amount of the solution c, and stirring is performed for 1 h to allow the aluminum oxide seed crystal to be adsorbed onto the platinum nanocube crystal face. The solution is subjected to repeated centrifugation and water washing, the excess aluminum oxide seed crystals in the solution were removed, and the precipitate was re-dispersed in the deionized water, to obtain a solution d. To obtain the one-dimensional aluminum oxide rod structure, a 0.1 Mol/L aluminum chloride solution, a 0.1 Mol/L hexamethylenetetramine (HMTA) solution and a sodium bis(2-ethylhexyl) sulfosuccinate (AOT) solution 0.1 Mol/L were successively added to the solution d, and reaction was performed at 60° C. for 15 h. The solution is subjected to repeated centrifugation and water washing, and the precipitate was re-dispersed in the deionized water, to obtain the final platinum nanorod-aluminum oxide nanorod heterojunction.

Additionally, a person skilled in the art may further make other changes within the spirit of the present invention. Certainly, the changes made according to the spirit of the present invention should fall within the protection scope claimed by the present invention.

What is claimed is:

1. A surface plasmon-semiconductor heterojunction resonant optoelectronic device, comprising: a plasmonic nanostructure, a surface ligand molecule, a plasmonic crystal face structure, a semiconductor nanostructure seed crystal and a one-dimensional semiconductor nanostructure, wherein the surface ligand molecule is modified on the plasmonic nanostructure in a tight contact manner, the plasmonic crystal face structure is bound to the surface ligand molecule in the tight contact manner, the semiconductor nanostructure seed crystal is located on the plasmonic crystal face structure in the tight contact manner, the one-dimensional semiconductor nanostructure is located on the semiconductor nanostructure seed crystal in the tight contact manner.

2. The surface plasmon-semiconductor heterojunction resonant optoelectronic device according to claim 1, wherein the plasmonic nanostructure is an anisotropic crystal material with a morphology of a triangular plate, a wire or a decahedron, having a long axis size of 10-10000 nm, or the plasmonic nanostructure is an isotropic crystal material with a morphology of a sphere or a symmetric polyhedron, having a size of 10-3000 nm.

3. The surface plasmon-semiconductor heterojunction resonant optoelectronic device according to claim 1, wherein material of the plasmonic nanostructure is a metal material with a plasmonic effect, and the metal material with the plasmonic effect is gold, silver, copper, aluminum, or platinum.

4. The surface plasmon-semiconductor heterojunction resonant optoelectronic device according to claim 1, wherein a material of the surface ligand molecule is cetyltrimethylammonium bromide (CTAB), polyvinylpyrrolidone (PVP) or mercaptopropionic acid (MPA).

5. The surface plasmon-semiconductor heterojunction resonant optoelectronic device according to claim 1, wherein the plasmonic crystal face structure is an anisotropic material with a morphology of a triangular plate, a cone or a cube, having a size of 1-10 nm.

6. The surface plasmon-semiconductor heterojunction resonant optoelectronic device according to claim 1, wherein the plasmonic crystal face structure is a small-sized metal nanostructure and has a material consistent with a material of the plasmonic nanostructure.

7. The surface plasmon-semiconductor heterojunction resonant optoelectronic device according to claim 1, wherein a morphology of the semiconductor nanostructure seed crystal is a sphere, a cone or a rod, a size of the semiconductor nanostructure seed crystal is 1-10 nm, and a material of the semiconductor nanostructure seed crystal is zinc oxide, aluminum oxide or cuprous oxide.

8. The surface plasmon-semiconductor heterojunction resonant optoelectronic device according to claim 1, wherein the one-dimensional semiconductor nanostructure is a one-dimensional nanostructure with a morphology of a rod, a cone or a tube, a size of the one-dimensional semiconductor nanostructure is 10-10000 nm, and the one-dimensional semiconductor nanostructure is a large-sized metal micro-nano structure and has a material consistent with a material of the semiconductor nanostructure seed crystal.

9. A preparation method for the surface plasmon-semiconductor heterojunction resonant optoelectronic device according to claim 1, comprising the following steps:
step one: constructing the plasmonic crystal face structure, comprising:

subjecting a 0.01-1 Mol/L aqueous solution of the plasmonic nanostructure to repeated centrifugation and water washing to obtain a first precipitate, and re-dispersing the first precipitate in deionized water, to obtain a first solution;

adding a 0.01-1 Mol/L aqueous solution of the surface ligand molecule to the first solution, and stirring, to allow the surface ligand molecule to be adsorbed onto a specific crystal face of the plasmonic nanostructure due to a crystal face selectivity, to obtain a second solution; and adding a 0.001-0.1 Mol/L aqueous solution of the plasmonic crystal face structure to the second solution, and stirring to allow the plasmonic crystal face structure and the surface ligand molecule in the specific crystal face of the plasmonic nanostructure to be in tight contact by virtue of a covalent bond, subjecting to repeated centrifugation and water washing to obtain a second precipitate, re-dispersing the second precipitate in deionized water, to obtain a third solution; and step two: preparing and continuously growing the semiconductor nanostructure seed crystal, comprising:

adding a 0.01-0.1 Mol/L aqueous solution of the semiconductor nanostructure seed crystal to the third solution to obtain a mixed solution, and stirring the mixed solution for 1-4 h to allow the semiconductor nanostructure seed crystal to be adsorbed onto the specific crystal face of the plasmonic nanostructure;

subjecting the mixed solution to repeated centrifugation and water washing, removing excess semiconductor nanostructure seed crystals in the mixed solution to obtain a third precipitate, and re-dispersing the third precipitate in deionized water, to obtain a fourth solution; and to obtain the one-dimensional semiconductor nanostructure, sequentially adding a 0.001-0.1 Mol/L aqueous solution of a metal salt, a 0.001-0.1 Mol/L aqueous solution of a weak reducing agent and a 0.01-0.1 Mol/L aqueous solution of a surface capping agent to the fourth solution and reacting at 60-90° C. for 1-18 h; subjecting to repeated centrifugation and water washing to obtain a fourth precipitate, and re-dispersing the fourth precipitate in deionized water, to obtain a final surface plasmon-semiconductor heterojunction.

10. The preparation method for the surface plasmon-semiconductor heterojunction resonant optoelectronic device according to claim 9, a material of the metal salt is a metal salt with a metallic element consistent with a metallic element in the semiconductor nanostructure seed crystal; a material of the weak reducing agent is ascorbic acid (AA), an aqueous solution of hydrogen peroxide ($H_2O_2$) or hexamethylenetetramine (HMTA); and a material of the surface capping agent is a capping agent configured for promoting a growth of the semiconductor nanostructure seed crystal along a one-dimensional direction, such as polyethylenimine (PEI), triton X-100, or sodium bis(2-ethylhexyl) sulfosuccinate (AOT).

11. The surface plasmon-semiconductor heterojunction resonant optoelectronic device according to claim 7, wherein the one-dimensional semiconductor nanostructure is a one-dimensional nanostructure with a morphology of a rod, a cone or a tube, a size of the one-dimensional semiconductor nanostructure is 10-10000 nm, and the one-dimensional semiconductor nanostructure is a large-sized metal micro-nano structure and has a material consistent with the material of the semiconductor nanostructure seed crystal.

* * * * *